US008948613B2

(12) United States Patent
Schmitt et al.

(10) Patent No.: US 8,948,613 B2
(45) Date of Patent: Feb. 3, 2015

(54) INTENSITY NOISE REDUCTION METHODS AND APPARATUS FOR INTERFEROMETRIC SENSING AND IMAGING SYSTEMS

(75) Inventors: Joseph M. Schmitt, Andover, MA (US); Victor Grinberg, Brighton, MA (US)

(73) Assignee: Lightlab Imaging, Inc., Westford, MA (US)

( * ) Notice: Subject to any disclaimer, the term of this patent is extended or adjusted under 35 U.S.C. 154(b) by 818 days.

(21) Appl. No.: 13/050,410

(22) Filed: Mar. 17, 2011

(65) Prior Publication Data

US 2011/0228280 A1 Sep. 22, 2011

Related U.S. Application Data

(60) Provisional application No. 61/314,759, filed on Mar. 17, 2010.

(51) Int. Cl.
*H04B 10/06* (2006.01)
*G01B 9/02* (2006.01)
*H03G 3/30* (2006.01)
*H04B 10/67* (2013.01)

(52) U.S. Cl.
CPC .......... *G01B 9/02074* (2013.01); *H03G 3/3084* (2013.01); *H04B 10/671* (2013.01); *G01B 9/02004* (2013.01); *G01B 9/02083* (2013.01)
USPC ........... 398/203; 398/202; 398/208; 398/209; 398/210; 398/212; 398/213; 398/214; 356/450; 356/477; 356/482; 600/425; 600/300

(58) Field of Classification Search
USPC ............ 398/202–214; 356/479–497; 600/504
See application file for complete search history.

(56) References Cited

U.S. PATENT DOCUMENTS

| | | | | |
|---|---|---|---|---|
| 4,613,752 A | * | 9/1986 | Davis | 250/227.19 |
| 4,718,121 A | | 1/1988 | Epworth | |
| 5,134,276 A | | 7/1992 | Hobbs | |
| 5,257,124 A | * | 10/1993 | Glaab et al. | 398/91 |
| 5,321,501 A | | 6/1994 | Swanson et al. | |
| 5,323,258 A | * | 6/1994 | Tsushima et al. | 398/203 |
| 5,457,563 A | | 10/1995 | Van Deventer et al. | |
| 5,459,570 A | | 10/1995 | Swanson et al. | |
| 5,465,147 A | | 11/1995 | Swanson | |
| 5,509,093 A | | 4/1996 | Miller et al. | |

(Continued)

FOREIGN PATENT DOCUMENTS

| | | | | |
|---|---|---|---|---|
| JP | 06-291563 | * | 10/1994 | H03F 3/30 |
| WO | 2009140617 | | 11/2009 | |

OTHER PUBLICATIONS

Chinn et al., "Optical Coherence Tomography Using a Frequency-Tunable Optical Source", Opt. Lett., 22:5 340-342 (1997).

(Continued)

*Primary Examiner* — Li Liu
(74) *Attorney, Agent, or Firm* — K&L Gates LLP

(57) ABSTRACT

In part, aspects of the invention relate to methods, apparatus, and systems for intensity and/or pattern line noise reduction in a data collection system such as an optical coherence tomography system that uses an electromagnetic radiation source and interferometric principles. In one embodiment, the noise is intensity noise or line pattern noise and the source is a laser such as a swept laser. One or more attenuators responsive to one or more control signals can be used in conjunction with an analog or digital feedback network in one embodiment.

16 Claims, 13 Drawing Sheets

(56) References Cited

U.S. PATENT DOCUMENTS

| | | | |
|---|---|---|---|
| 5,619,368 A | 4/1997 | Swanson | |
| 5,748,598 A | 5/1998 | Swanson et al. | |
| 5,784,352 A | 7/1998 | Swanson et al. | |
| 5,956,355 A | 9/1999 | Swanson et al. | |
| 6,111,645 A | 8/2000 | Tearney et al. | |
| 6,134,003 A | 10/2000 | Tearney et al. | |
| 6,160,826 A | 12/2000 | Swanson et al. | |
| 6,191,862 B1 | 2/2001 | Swanson et al. | |
| 6,204,921 B1 | 3/2001 | Strandjord et al. | |
| 6,282,011 B1 | 8/2001 | Tearney et al. | |
| 6,421,164 B2 | 7/2002 | Tearney et al. | |
| 6,445,939 B1 | 9/2002 | Swanson et al. | |
| 6,485,413 B1 | 11/2002 | Boppart et al. | |
| 6,501,551 B1 | 12/2002 | Tearney et al. | |
| 6,552,796 B2 | 4/2003 | Magnin et al. | |
| 6,556,685 B1* | 4/2003 | Urry et al. | 381/94.1 |
| 6,564,087 B1 | 5/2003 | Pitris et al. | |
| 6,570,659 B2 | 5/2003 | Schmitt | |
| 6,657,727 B1 | 12/2003 | Izatt et al. | |
| 6,706,004 B2 | 3/2004 | Tearney et al. | |
| 6,775,484 B1* | 8/2004 | Pfeiffer | 398/204 |
| 6,879,851 B2 | 4/2005 | McNamara et al. | |
| 6,882,428 B2 | 4/2005 | Baney et al. | |
| 6,891,984 B2 | 5/2005 | Petersen et al. | |
| 7,102,756 B2 | 9/2006 | Izatt et al. | |
| 7,208,333 B2 | 4/2007 | Flanders et al. | |
| 7,231,243 B2 | 6/2007 | Tearney et al. | |
| 7,241,286 B2 | 7/2007 | Atlas | |
| 7,414,779 B2 | 8/2008 | Huber et al. | |
| 7,415,049 B2 | 8/2008 | Flanders et al. | |
| 7,477,852 B2* | 1/2009 | Agarwal et al. | 398/210 |
| 7,625,366 B2 | 12/2009 | Atlas | |
| 7,813,609 B2 | 10/2010 | Petersen et al. | |
| 7,848,791 B2 | 12/2010 | Schmitt et al. | |
| 7,916,387 B2 | 3/2011 | Schmitt et al. | |
| 7,935,060 B2 | 5/2011 | Schmitt et al. | |
| 8,121,494 B2* | 2/2012 | Andrew et al. | 398/202 |
| 8,358,461 B2 | 1/2013 | Huber et al. | |
| 2002/0161351 A1 | 10/2002 | Samson et al. | |
| 2005/0201662 A1 | 9/2005 | Petersen et al. | |
| 2005/0231727 A1* | 10/2005 | Podoleanu et al. | 356/479 |
| 2006/0095065 A1 | 5/2006 | Tanimura et al. | |
| 2007/0236700 A1* | 10/2007 | Yun et al. | 356/491 |
| 2007/0276269 A1* | 11/2007 | Yun et al. | 600/504 |
| 2008/0252900 A1* | 10/2008 | Hatori | 356/482 |
| 2009/0046295 A1 | 2/2009 | Kemp et al. | |
| 2009/0116851 A1* | 5/2009 | Heffner et al. | 398/208 |
| 2009/0174931 A1 | 7/2009 | Huber et al. | |
| 2009/0284749 A1* | 11/2009 | Johnson et al. | 356/497 |
| 2009/0306520 A1 | 12/2009 | Schmitt et al. | |
| 2010/0076320 A1 | 3/2010 | Petersen et al. | |
| 2010/0094127 A1 | 4/2010 | Xu | |
| 2010/0253949 A1 | 10/2010 | Adler et al. | |
| 2011/0007315 A1 | 1/2011 | Petersen et al. | |
| 2011/0071404 A1 | 3/2011 | Schmitt et al. | |
| 2011/0071405 A1 | 3/2011 | Judell et al. | |
| 2011/0101207 A1 | 5/2011 | Schmitt | |
| 2011/0151980 A1 | 6/2011 | Petroff | |
| 2011/0157686 A1 | 6/2011 | Huber et al. | |
| 2011/0172511 A1 | 7/2011 | Schmitt et al. | |
| 2011/0178413 A1 | 7/2011 | Schmitt et al. | |
| 2011/0190586 A1 | 8/2011 | Kemp | |
| 2011/0216325 A1 | 9/2011 | Schmitt | |
| 2011/0228280 A1 | 9/2011 | Schmitt et al. | |
| 2012/0057157 A1 | 3/2012 | Petersen et al. | |
| 2012/0236883 A1 | 9/2012 | Adler | |
| 2012/0238869 A1 | 9/2012 | Schmitt et al. | |
| 2012/0250028 A1 | 10/2012 | Schmitt et al. | |
| 2012/0310081 A1 | 12/2012 | Adler et al. | |
| 2013/0010303 A1 | 1/2013 | Petersen et al. | |
| 2013/0012811 A1 | 1/2013 | Schmitt et al. | |
| 2013/0023761 A1 | 1/2013 | Petroff | |
| 2013/0051728 A1 | 2/2013 | Petroff | |
| 2013/0072805 A1 | 3/2013 | Schmitt et al. | |

OTHER PUBLICATIONS

Yun et al., "High-speed Optical Frequency-Domain Imaging", Opt. Express, 11:22 2953-2963 (2003).

Moon et al., "Normalization Detection Scheme for High-Speed Optical Frequency-Domain Imaging and Reflectometry", Opt. Express, 15:23 15129-15146 (2007).

"A Survey of Methods Using Balanced Photodetection", New Focus, San Jose, USA, pp. 1-8.

Hafiz et al., "Digitally Balanced Detection for Optical Tomography", Review of Scientific Instruments 78, 9 pgs. (2007).

"Model 2007 & 2017 User's Manual Nirvana Auto-Balanced Photoreceivers", Dec. 2002, pp. 1-36.

* cited by examiner ns, 10 ods, systems and apparatuses that substantially reduce noise
INTENSITY NOISE REDUCTION METHODS AND APPARATUS FOR INTERFEROMETRIC SENSING AND IMAGING SYSTEMS

RELATED APPLICATIONS

This application claims priority to provisional application U.S. Ser. No. 61/314,759 filed Mar. 17, 2010, the disclosure of which is herein incorporated by reference in its entirety.

FIELD OF INVENTION

The invention relates to the field of sensing and imaging and more specifically to the design and implementation of detection systems and related components for optical coherence tomography and other data collection technologies.

BACKGROUND OF INVENTION

Intensity fluctuations of a light source can markedly degrade the sensitivity and dynamic range of an interferometric measurement system such as an optical coherence tomography (OCT) system. In frequency-domain data collection systems, intensity noise can be particularly troublesome. This occurs because the high-speed tunable lasers often used in such systems may exhibit rapid wavelength-dependent gain fluctuations. These fluctuations can occur while tuning over a wide spectral band. The conventional method for mitigating the effects of source intensity noise is to combine signals produced by a pair of photodetectors at the output of a balanced interferometer, as illustrated in FIG. 1. FIG. 1 depicts a passive system 1 in the sense that active feedback or other changes over time with respect to component properties or input signals are not monitored or used. The system of FIG. 1 can be used as the front end for an OCT data collection system.

In an ideal balanced interferometer, the phase-coherence component of the reference field interferes with the phase-coherent component of the sample field (shown on the left side of FIG. 1) to generate a pair of signals with opposite phases at the outputs of the photodetectors shown as two balanced photodiodes in FIG. 1. The two input intensities I$^+$ and I$^-$ of light from the sample field and reference field are coupled and then directed to the photodiodes as shown. When subtracted, these two coherent signal components produce an interference signal with double the amplitude of the individual signals.

Further, the incoherent intensity fluctuations of the light source cancel, on average, after subtraction. In practice, however, complete suppression of the intensity fluctuations of the source is difficult to achieve. The difficulty arises because the photocurrents must be equalized and subtracted precisely. This subtraction process is performed in a passive manner for all input frequencies for the system of FIG. 1. In practice, the amplitude of intensity noise can be hundreds of times greater than the coherent signal amplitude. As a result, the common-mode rejection ratio (a measure of the extent signals common to the inputs of a device are rejected) of the balanced photodetectors and photoamplifier must remain high over a wide frequency band.

In the arrangement illustrated in FIG. 1, deviations from the ideal 50:50 split ratio of the fiber-optic coupler, in addition to differences in the responsiveness and coupling efficiencies of the photodiodes, typically result in photocurrent imbalances of at least a few percent. Even if these imbalances can be compensated by manual adjustment at the time of system manufacture, imbalances reappear over time as a result of long-term drifting in the properties of the components. Consequently, passive balancing methods are not adequate for use in many applications.

Accordingly, a need therefore exists for noise reduction methods, apparatus, and systems that overcome these limitations.

SUMMARY OF THE INVENTION

The present invention relates to electronic balancing methods, systems and apparatuses that substantially reduce noise such as intensity noise and pattern line noise in frequency-domain optical coherence tomography and in other interferometric sensing and imaging systems. One aspect of the invention is its ability to actively suppress wideband (DC—250 MHz) noise while amplifying the desired interference signals and without degrading signal quality. In this exemplary wideband noise range, DC (or direct current) corresponds to zero. In one embodiment, inclusion of zero within an auto balance method or device can help avoid saturation of the photoamplifier. This is accomplished by sampling the low-frequency intensity noise and applying active electronic feedback to cancel common-mode noise. This noise cancellation can be performed at both high and low frequencies on an automatic basis using one or more control signals. This active or automatic approach offers improvements relative to simply passively subtracting two signals as discussed above.

Electronic attenuation methods are disclosed that support bi-directional operation over wide frequency bands. In one embodiment, the band of interest is from about 0 to about 250 MHz, including points and sub-ranges there between. In one embodiment, bidirectional operations refers to the characteristic that the active or automatic balance methods and devices can accommodate either photocurrent being higher than the other, i.e., attenuation is applied automatically to the highest photocurrent, with no need to bias one of the photocurrents higher than the other.

The methods have the additional advantage of low cost and simplicity. Currently, available auto-balancing photoreceivers are expensive and are limited to operation over a narrow low frequency band (typically <100 KHz). Techniques for extending the methods to polarization diversity detection are also described. In one embodiment, use of the methods and devices described herein result in a noise reduction of at least about 25 dB. In one embodiment, the noise reduction achieved by an embodiment of the invention ranges from about 25 dB to about 50 dB.

In one embodiment, the invention relates to a method of reducing or suppressing intensity noise from a laser source in an optical coherence tomography system. The method includes transmitting light from a laser to an interferometer; generating a plurality of photocurrents during an optical coherence tomography data collection session, each of the photocurrents proportional to light received from the interferometer; converting the plurality of photocurrents to an amplified signal comprising a laser intensity noise component using an amplifier; and transmitting a first control signal to control attenuation of at least one of the plurality of photocurrents. The first control signal can be generated using the laser intensity noise component. The method can also include the step of transmitting a second control signal to control attenuation of at least one of the plurality of photocurrents. The method can also include the step of generating the first control signal by filtering the amplified signal, integrating the filtered amplified signal, and amplifying the integrated filtered amplified signal. In one embodiment, attenuation of at least one of the plurality of photocurrents is changed in response to the control signal being received by an attenuator selected from the group of a photoreceiver, a transistor, a diode, a resistor, a variable optical attenuator, a variable gain amplifier, a pair of resistors in electrical communication with a pair of transistors, and combinations thereof. The method can also include the step of actively balancing a first photo receiver and a second photoreceiver by repeating the step of transmitting the control signal until the laser noise component reaches a minimum.

In one embodiment, the invention relates to an optical coherence tomography system. The system includes a first photoreceiver for receiving light from an interferometer in optical communication with a laser having laser intensity noise; a first attenuator in communication with the first photoreceiver, wherein the first attenuator is configured to change one of a first optical or a first electrical property of the first attenuator in response to a first control signal; a second photo receiver for receiving light from the interferometer; a second attenuator in communication with the second photoreceiver, wherein the second attenuator is configured to change one of a second optical or a second electrical property of the second attenuator in response to a second control signal; an amplifier having a first input in electrical communication with the first photoreceiver and a first output, the amplifier configured to transmit, from the first output, an amplified signal comprising a laser intensity noise component; and a feedback network in electrical communication with the amplifier, the feedback network configured to receive the amplified signal and generate the first control signal and the second control signal at least in response to the laser intensity noise component. In one embodiment, the first and second attenuators are selected from the group consisting of a variable optical attenuator, a bipolar transistor, a MOSFET, a diode, a current-splitting attenuator, and a resistor.

The feedback network can include (a) a filter that transmits frequencies below an interference signal band, (b) an integrator in electric communication with the filter, and (c) a pair of rectifying amplifiers in electrical communication with integrator. In addition, in another embodiment, the feedback network can include (a) a bandpass filter that transmits frequencies either below or above an interference signal band, (b) an RMS detector in electrical communication with the bandpass filter, (c) an analog-to-digital converter in electrical communication with the RMS detector, (d) a microprocessor in electrical communication with the analog-to-digital converter, and (e) a digital-to-analog converter in electrical communication with the microprocessor. The feedback network can be configured to transmit one of the first or second control signals using the digital-to-analog converter to maintain a null in an RMS noise signal received at the RMS detector.

In one embodiment, the feedback network is configured to operate synchronously with a sweep period of the laser. The feedback network can compute the first control signal during a non-imaging cycle of the interferometer and transmits the first control signal during an imaging cycle to reduce or suppress the laser noise component. In one embodiment, the light emitted by the laser is amplitude modulated at a fixed frequency to create a first signal in a reference arm of the interferometer and wherein a second signal at an output of the system is demodulated to generate a phase-sensitive error signal that is processed by the feedback network. In one embodiment, the first attenuator is a first transistor and the second attenuator is a second transistor, wherein the first and second transistors are configured to differentially shunt photocurrents at the first input of the amplifier in response to the first and second control signals.

In one embodiment, the first attenuator is a first variable-gain amplifier having an input and an output and wherein the second attenuator is a second variable-gain amplifier having an input and an output. The system can also include a transformer, wherein outputs of each of the first and second variable-gain amplifiers are in electrical communication with the transformer. The system can also include a phase shifter, wherein a signal from the first variable-gain amplifier passes through the phase shifter before combining with another signal from the second variable-gain amplifier.

In one embodiment, the first attenuator includes a variable optical attenuator having an electronic control input configured to receive the first control signal, the variable optical attenuator interposed between an output of the interferometer and the first photoreceiver. In addition, the first photoreceiver and the second photoreceiver can include a first actively balanced receiver and further comprising a dual-channel polarization splitter configured to split light from the interferometer into light of a first polarization and light of a second polarization, a second actively balanced receiver comprising a third photoreceiver and a fourth photoreceiver, wherein the first actively balanced receiver is positioned to receive light of a first polarization and the second actively balanced receiver is positioned to receive light of the second polarization. The system can include a second amplifier having a first input in electrical communication with the second photoreceiver and a first output, the second amplifier configured to transmit, from the first output, an amplified signal comprising a laser intensity noise component and measurement data from the interferometer. In one embodiment, the amplifier is a transimpedance amplifier and wherein the second amplifier is a transimpedance amplifier.

In one embodiment, the invention relates to optical coherence tomography system. The system includes an interferometer having a sample signal output and a reference signal output; a laser in optical communication with the interferometer, the laser having laser intensity noise; an actively balanced photoreceiver for receiving light from the sample signal output and the reference signal output, the actively balanced photoreceiver comprising an attenuator and a control signal input; a feedback network in electrical communication with the actively balanced photoreceiver, the feedback network configured to generate a control signal at least in response to the laser intensity noise component such that laser intensity noise or pattern line noise is reduced or suppressed by the attenuator in response to receiving the control signal at the control signal input. The attenuator can include a first resistor and a second resistor connected at a first node and a first transistor and a second transistor connected at a second node and in electrical communication with the first resistor and the second resistor. In one embodiment, the attenuator is selected from the group consisting of a variable optical attenuator, a transistor, a MOSFET, a diode, a current splitting attenuator, a resistor, a variable gain amplifier, and a microwave transistor. In one embodiment, the feedback network includes (a) a filter that transmits frequencies below an interference signal band, (b) an integrator in electric communication with the filter and (c) a pair of rectifying amplifiers in electrical communication with integrator.

Further, in one embodiment, the feedback network includes (a) a bandpass filter that transmits frequencies either below or above an interference signal band, (b) an RMS detector in electrical communication with the bandpass filter, (c) an analog-to-digital converter in electrical communication with the RMS detector, (d) a microprocessor in electrical communication with the analog-to-digital converter, and (e) a digital-to-analog converter in electrical communication with the microprocessor. In one embodiment, the methods and devices are selected to operate at least in part in the about 1 MHz to about 250 MHz range.

In one aspect, the invention relates to an apparatus for suppressing or reducing intensity noise in an interferometric sensing or imaging system. The apparatus can include a pair of photodetectors connected to at least one output of a balanced interferometer; a matched pair of wideband variable attenuators associated with the pair of photodetectors, the wideband variable attenuators configured to subtract at least one current generated by the pair of photodetectors; a wideband amplifier having an output, the amplifier configured to amplify differential photocurrents to produce a signal with reduced intensity noise; and a feedback network configured to continuously sample residual intensity noise in response to an interference signal at the output of the wideband amplifier and produce a pair of oppositely directed signals to control attenuation of at least one photocurrent. In one embodiment, the apparatus includes attenuators such as one or two pairs of microwave transistors with complementary control signals that steer photocurrents into either the inverting or non-inverting terminal of a wideband transimpedance amplifier with differential inputs and outputs. In another embodiment, the differential outputs are combined in a transformer such as a wideband radio-frequency transformer.

In one aspect, the invention relates to two independent actively balanced receivers with electronic balancing for noise suppression. In one embodiment, a first photodetector in the first receiver connects to a vertical polarization output of a polarization splitter at one output of an unbalanced interferometer. In another embodiment, a second photodetector in the first receiver connects to the output of a polarization insensitive beam splitter that samples the reference power. In one embodiment, the second photodetector in the first receiver connects to the horizontal polarization output of a polarization splitter at the output of an unbalanced interferometer and the second photodetector in the first receiver connects to the output of a polarization insensitive beam splitter.

The embodiments described herein are suitable for use with swept source and tunable sources such as lasers and other electromagnetic sources.

BRIEF DESCRIPTION OF THE DRAWINGS

The figures are not necessarily to scale, emphasis instead generally being placed upon illustrative principles. The figures are to be considered illustrative in all aspects and are not intended to limit the invention, the scope of which is defined only by the claims.

DETAILED DESCRIPTION

The following description refers to the accompanying drawings that illustrate certain embodiments of the invention. Other embodiments are possible and modifications may be made to the embodiments without departing from the spirit and scope of the invention. Therefore, the following detailed description is not meant to limit the present invention. Rather, the scope of the present invention is defined by the appended claims.

Laser intensity noise plays an important role in frequency-domain optical coherence tomography (FD-OCT). FD-OCT can employ a rapidly tuned laser source to measure light backscattered from a sample at different optical delay times. Two-dimensional images of reflectivity versus depth at a resolution of 5-15 µm can be acquired from a scattering volume at frame rates exceeding 100 frames/s. FD-OCT has been applied widely in ophthalmology, cardiology, and other fields of medicine.

Figure 2:
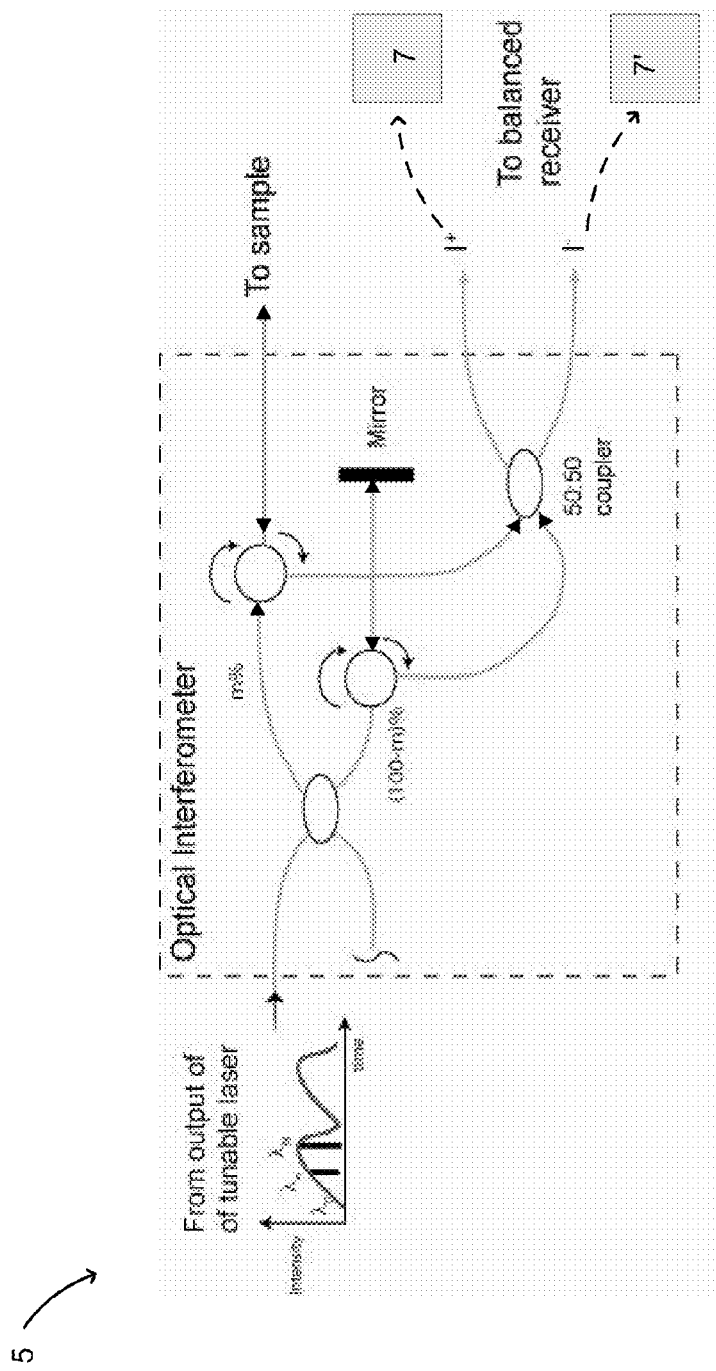
FIG. 2 is a schematic diagram of a frequency-domain optical coherence tomography (FD-OCT) system that employs a photoreceiver in accordance with an illustrative embodiment of the invention.

FIG. 2 shows the optical configuration of an FD-OCT system 5. Light from a swept-wavelength laser (alternatively a tunable laser) L (on the left) is directed by an interferometer 6 into separate sample and reference paths which lead to the sample and a reference mirror, respectively. Light backscattered from the sample combines with light reflected from the reference mirror. Specifically, this combined light generates interference signals at the photodetectors. The frequencies received as these photodetectors correspond to the differences between the distances traveled by the optical fields in the sample and reference paths.

In one embodiment, the sample field includes light collected using an optical coherence tomography probe that includes a rotatable optical fiber. When light is directed along the fiber and reflected from the sample, one or more times, this can constitute an example of an optical coherence tomography data collection session. During such a session one or more photoreceivers receive light from the interferometer that is correlated with light reflected from the sample. In one embodiment, this results in the generation of a plurality of photocurrents at one or more of the photoreceivers.

In one embodiment, the interference signals are Fourier-transformed to generate an array of data (an 'A-line') that corresponds to the amplitudes of the reflections from the sample at increasing depths. An image of the sample is generated by acquiring a series of A-lines as the sample beam scans over the sample. Fiber ring lasers and short-cavity semiconductor lasers are typically used to satisfy the required line width and scan rate requirements for FD-OCT. Most of these lasers emit relatively high levels of intensity noise, because multiple closely spaced modes coexist within the emission band of the lasers.

Therefore, interferometers used with FD-OCT systems, such as the example system 5 shown in FIG. 2, are usually configured for passive balanced detection to reduce laser intensity noise (such that attenuators and control signals are not used as discussed below). Many FD-OCT systems also suffer from pattern line noise, an especially pernicious form of intensity noise that results from multiple reflections within parasitic cavities inside the laser source or interferometer. Even very weak parasitic cavity reflections give rise to visible pattern lines in FD-OCT images, which are difficult to eliminate by using conventional passive balancing techniques. Thus, in one embodiment the methods, devices and systems described here in use one or more attenuators having a control signal input to reduce one or both of pattern line noise and laser intensity noise.

In contrast with a passive balancing approach, the system 5 of FIG. 2 can include attenuators 7 and 7' to enable active or automatic balancing. As shown, by the dotted arrows, these elements can be in communication with the incident light or the photoreceivers themselves. Specifically, attenuators 7 and 7' can be optically connected to the light from the sample and reference field, such as the case when these elements 7 and 7' include variable optical attenuators. In addition, when the elements 7 and 7' are electrical in nature they can be placed such they are in electrical communication with the photoreceivers that receive and transform the light from the sample or reference field into photocurrents or time varying voltages. As an example, elements 7 and 7' may include individual attenuators, attenuation circuits or other controllable elements such as transistors, diodes, and other components or subsystems as outlined below. In a preferred embodiment, active balancing elements 7 and 7' include control signal inputs that allow their optical or electrical characteristics to be changed.

Figure 1:
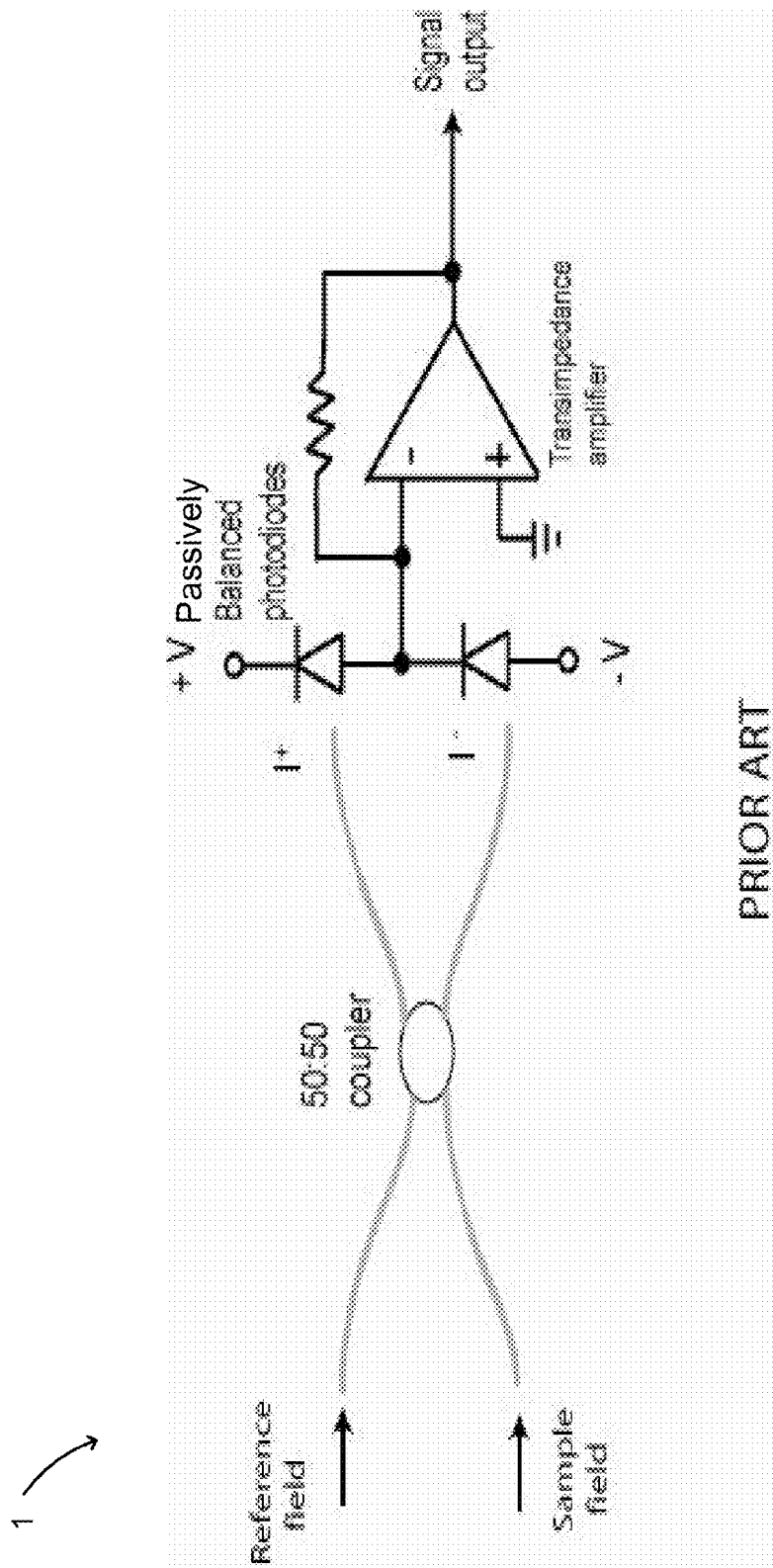
FIG. 1 is a schematic diagram of a passively balanced photoamplifier at the output of an interferometer.

The performance of a passively balanced photoreceiver shown in FIG. 1 depends on equalization of the incident intensities ($I^+$, $I^-$), responsivities of the photodiodes ($R_A$, $R_B$), and transimpedances of the amplifier for positive and negative current inputs ($G^+$, $G^-$):

$$R_A I^+ G^+ = R_B I^- G^- \quad [\text{Eq. 1}]$$

This matching condition can be satisfied, in general, at only one noise frequency because of the finite carrier transit time and parasitic reactance of the photodetectors. For a given circuit, the amplifier gain and common-mode rejection ratio also depend on frequency because of reactive and carrier-transit imbalances within the amplifier electronics. Therefore, to ensure high intensity-noise suppression, a passive approach fails. Instead, the incident intensities can be adjusted to compensate for both static and dynamic differences in the photodiodes and amplifier that produce residual noise voltages at the output. An active or automatic approach such a feedback based approach allows for static and dynamic compensation for such differences over time.

One preferred embodiment of the present invention described below employs a pair of wideband photocurrent attenuators controlled by a filtered feedback signal. This embodiment maintains balance electronically during the entire period of the wavelength sweep of the tunable laser. This approach enables dramatic improvement of performance compared to that of a passive system. The feedback nulls noise voltages sampled within a defined frequency band at the output of an amplifier. Thus, in one embodiment the noise voltages are nulled continuously within the adjacent signal band by applying the photocurrent attenuation in the same proportion over a wide frequency range that includes the signal band. These photocurrent attenuators can be implemented using various elements such as MOSFETS, bipolar transistors, pin diodes, optical attenuators, and combinations thereof. In some embodiments, these photocurrent attenuators are in electrical communication with the photoreceivers of an optical coherence tomography system. A feedback network for generating control signals that regulate the photocurrent attenuators can also be used in a preferred embodiment.

Figure 3:
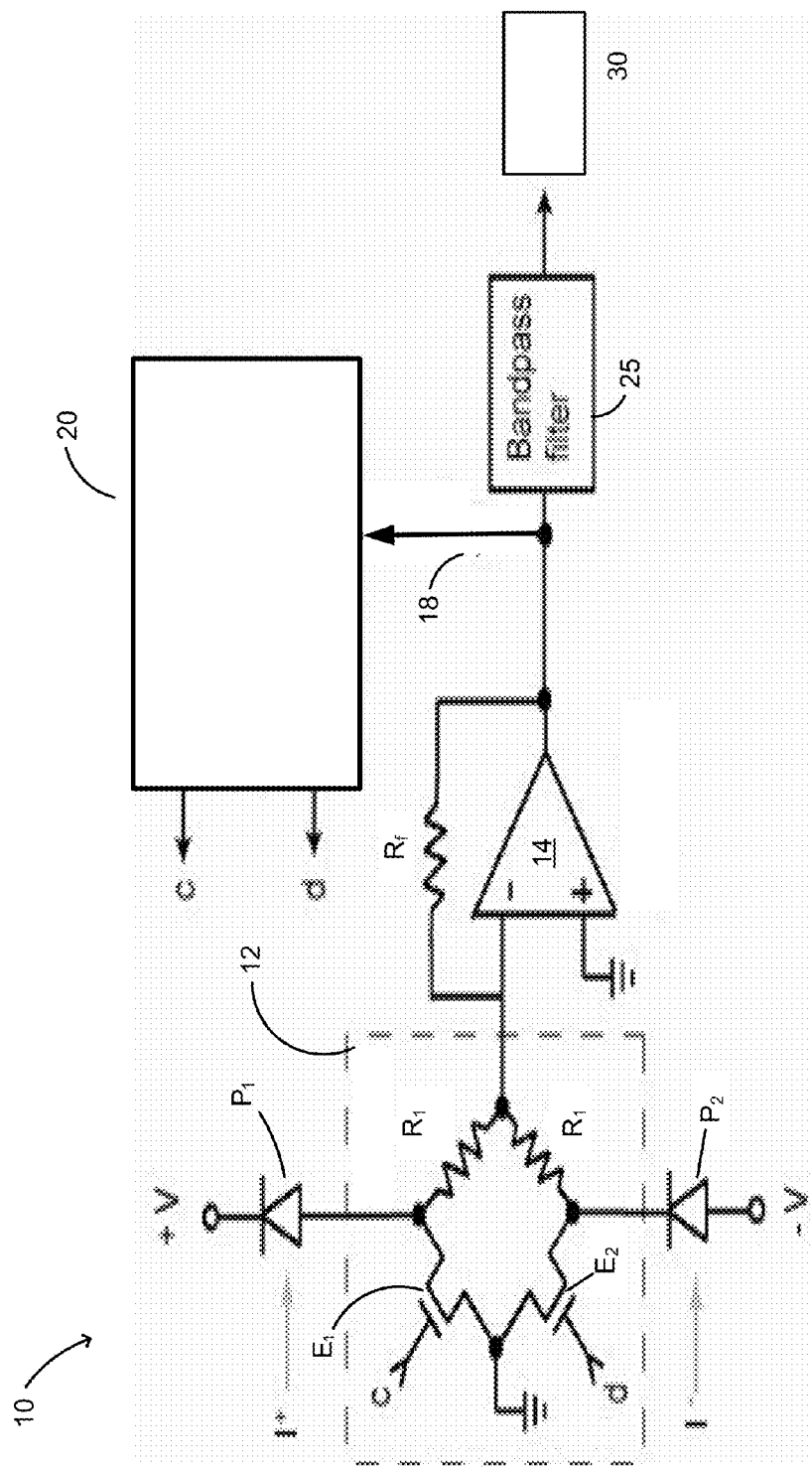
FIG. 3 is a schematic diagram of an actively balanced photoreceiver for intensity noise reduction in accordance with an illustrative embodiment of the invention.

FIG. 3 shows system 10 that includes an actively balanced photoreceiver. This photoreceiver includes first $P_1$ and second $P_2$ photodiodes and a balanced photoamplifier configured for active intensity noise suppression according to the present invention. Photocurrents are generated by photodiodes $P_1$, $P_2$ in response to input electromagnetic radiation $I^-$, $I^+$ having a time varying intensity. This radiation can be light from an optical coherence tomography system. Thus, light from a sample and light from a reference (such as a reflector, for example) can be directed to the photodiodes $P_1$, $P_2$ in one embodiment. Since the photodiodes generate an output current in response to incident photons, a transimpedance amplifier 14 with a known feedback resistor $R_f$ is used to generate an output voltage. Knowing the value of $R_f$ allows the photocurrent to be calculated. In one embodiment, a transimpedance can include an optional capacitor in parallel with $R_f$ resistor.

Noise suppression or reduction occurs through an active process in the system 10. As shown, active feedback is used in the form of control voltages c and d. This is in contrast to the passive systems of FIG. 1. In addition, the active noise reduction or suppression is possible through an attenuator 12 such as a current splitting attenuator or other attenuation circuit or element which is responsive to one or more control signals such as for example control signals c and d.

In one embodiment, both of the photodiodes are in electric communication with this attenuator 12 as shown in FIG. 3. Resistors $R_1$ and $R_2$ and a transistor or switch pair $E_1$, $E_1$ are shown in a bridge configuration with a connection to ground on one the left side and an output node connected to a transimpedance amplifier 14 on the right. The value of $R_1$ and $R_2$ are typically equal in value and in the range of about 20 to about 1000 ohms. Values at the upper end of this range allow wide mismatches in nominal photocurrents under unbalanced condition, but increase thermal noise at high frequency. In two embodiments, R1 and R2 both equaled 100 or 200 ohms, allowing low-noise operation to 250 MHz and 100 MHz, respectively, with photocurrent imbalances as high as 25%.

Depending on the values of the analog or digital control voltages c and d applied to $E_1$, $E_2$ (in one embodiment $E_1$, $E_2$ correspond to the gates of pair of MOSFET transistors), a varying fraction of either the photocurrent associated with intensity $I^-$ or the photocurrent associated with intensity $I^+$ is diverted from the inverting input of the transimpedance amplifier 14 to ground. In one embodiment, the transimpedance amplifier 14 includes an operational amplifier and a feedback resistor $R_f$. These $E_1$, $E_2$ circuit elements can be MOSFET transistors, microwave transistors, or other control signal responsive circuit elements in one embodiment.

With respect to FIG. 3, the control voltages c and d are derived from the auto-balance feedback network 20 that amplifies small positive-going or negative-going noise voltages at the output of the transimpedance amplifier 14. In one embodiment, the control voltages c and d are driven rapidly in the direction that minimizes the sampled noise voltage. The transimpedance amplifier 14 is designed to provide an approximately constant gain over the DC-120 MHz frequency range. This can be set by the feedback resistor $R_f$. Low capacitance MOSFETs (typical drain-source capacitance <0.6 pf) having isolated gate connections are desirable for use as $E_1$, $E_2$ elements in some embodiments to achieve flat and equal frequency responses for both the signal and noise components of the photocurrents associated with intensities $I^+$ and $I^-$.

The output of transimpedance amplifier 14 is a time varying voltage signal with respect to which noise suppression or reduction has been applied. This signal is a voltage that is proportional to the photocurrent as determined by the value of $R_f$. This amplified signal is then transmitted to the input 18 of the feedback network 20 and a bandpass filter 25. This amplified signal contains laser intensity noise. The filter 25 is configured to pass a particular frequency band of signal. Additional details relating to a particular embodiment of a feedback network 20 are described below with respect to FIG. 7. Once signal has been processed by filter 28 it is ready for subsequent transmission and processing at an output such as a preamplifier output 30. In an exemplary Fourier-domain OCT system, the signal output at the output of the preamplifier is typically amplified and filtered for anti-aliasing in additional processing stages before being digitized and Fourier-transformed.

Still referring to the general embodiment of FIG. 3, with external biasing, bipolar transistors or Schottky-diode-based RF attenuators can be used as circuit elements $E_1$, $E_1$ in place of transistors. Unfortunately, these devices generally exhibit higher offset currents and poor linearity, which can degrade the dynamic range and common-mode suppression of the amplifier.

Another design consideration is the reduction of stray capacitances. The stray capacitances associated with each transistor or other circuit element $E_1$, $E_1$ can be reduced further using various components and subsystems. For example, in one embodiment by connecting two MOSFET transistors in series and controlling both with the same isolated gate signal, stray capacitances are reduced. Further, as a design consideration, selection of an operational amplifier 14 that exhibits a sufficiently wide gain-bandwidth product (>3 GHz) facilitates maintaining constant gain at high frequencies.

If noise cancellation at DC is desired, the offset of the amplifier 14 can be set sufficiently low to avoid introducing a static offset in the photocurrents, which can reduce the degree of noise suppression. The effect of the offset of the operational amplifier 14 can be reduced further by adding an offset cancellation resistor with a resistance equal to that of the feedback resistor in series with the non-inverting input of the operational amplifier 14. In such a configuration, the sources of the transistors should be connected to the non-inverting terminal instead of ground.

Figure 4:
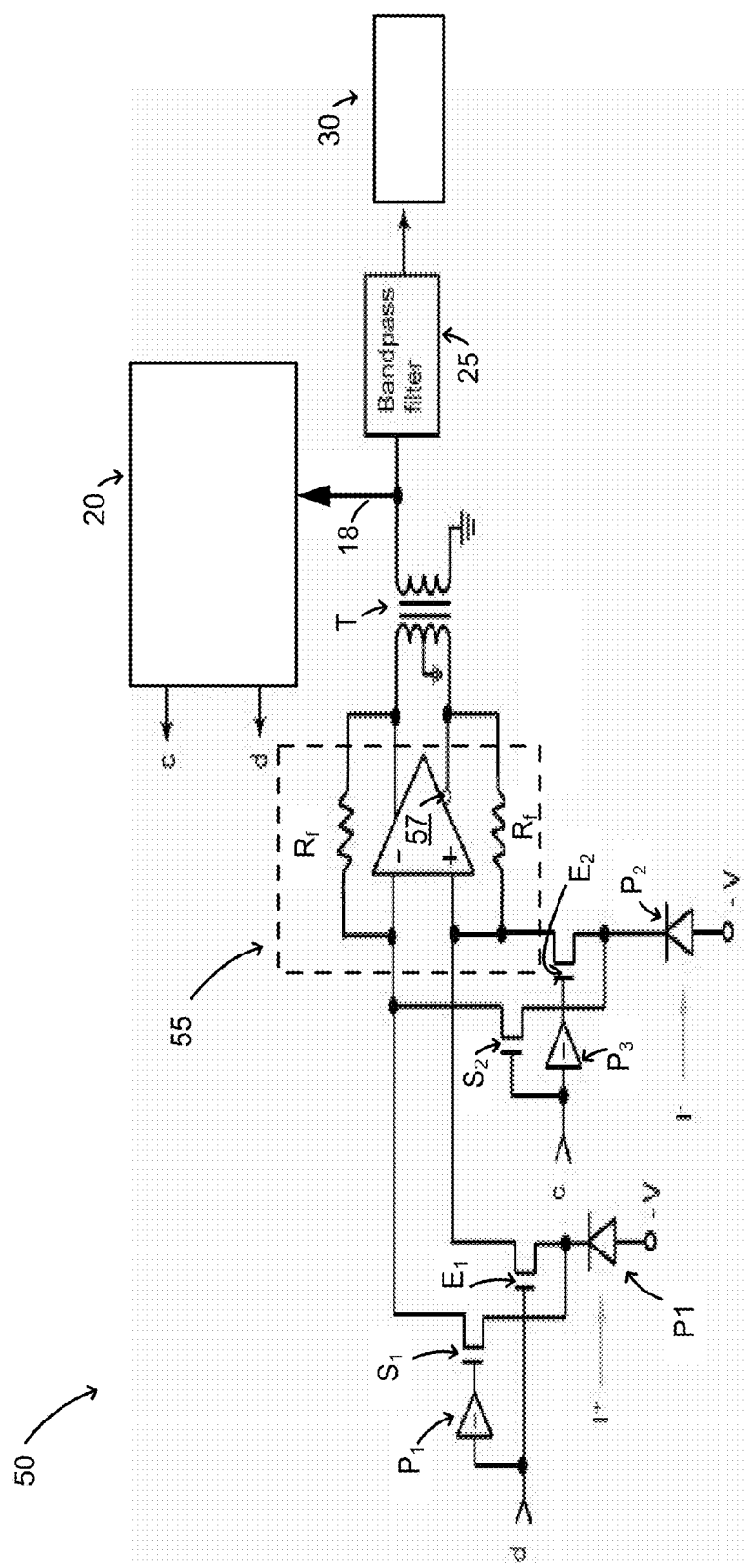
FIG. 4 is a schematic diagram of an alternative embodiment of an actively balanced photoreceiver that includes one or two pairs of transistors or other switching elements in accordance with an illustrative embodiment of the invention.

Another embodiment of an intensity noise suppression or reduction system 50 is depicted in FIG. 4. The basic principle of operation of this circuit element-based system is similar to that of the system in FIG. 3. Namely, control signals are used to change the properties of responsive elements to reduce intensity noise in a given photocurrent. One difference from the system 10 of FIG. 3 is that a differential transimpedance amplifier 55, which includes an operational amplifier 57 and reference resistors $R_f$, is used in the system 50. In FIG. 4, one or two pairs of transistors, switches, or similar electrical elements can be used. As shown, the system 50 includes two pairs of transistors in a differential arrangement to balance the photocurrents from photodiodes $P_1$, $P_2$ or other signal sources at the input of a transimpedance amplifier 55 with differential inputs and outputs.

The system 50 of FIG. 4 include a first photodiode $P_1$ and a second photodiode $P_2$ that are in electrical communication with a first controllable element $E_1$ and a second controllable element $E_2$. As was the case with FIG. 3, $E_1$, $E_2$ can be transistors such as MOSFETS, other suitable controllable circuit elements, or other attenutors. A third controllable element or switch $S_1$ and a fourth controllable element or switch $S_2$ are also in electric communications with the first photodiode $P_1$ and the second photodiode $P_2$. In turn, each of the four controllable elements or attenuators $E_1$, $E_2$, $S_1$ and $S_2$ are electrical communication with a differential transimpedance amplifier 55. The amplifier 55 is in electrical communication to a transformer T. In turn, the transformer T is in electrical communication to a feedback network 20. A suitable network 20 is described herein such as with respect to FIGS. 7 and 10.

In this system 50, instead of diverting the excess current from one of the photodiodes $P_1$, $P_2$ to ground, a second MOSFET transistor or switch $S_1$, $S_2$ for each of the photodiodes $P_1$, $P_2$, with its gate controlled by a complementary voltage, steers the photocurrent to the opposite input of a differential transimpedance amplifier. This arrangement improves the efficiency of the balanced detector. This improvement occurs because both the phase of the noise photocurrent and its amplitude are altered to achieve a balanced condition. To form a single-ended output, the differential outputs of the differential transimpedance amplifier 55 are combined by a transformer T such as a wideband RF transformer. In turn, the output voltage from the transformer T continues as a signal which is transmitted along input 18 to the feedback network 20 or filtered using the bandpass filter before reaching an output 30 for further processing, amplification or transmission.

Figure 5:
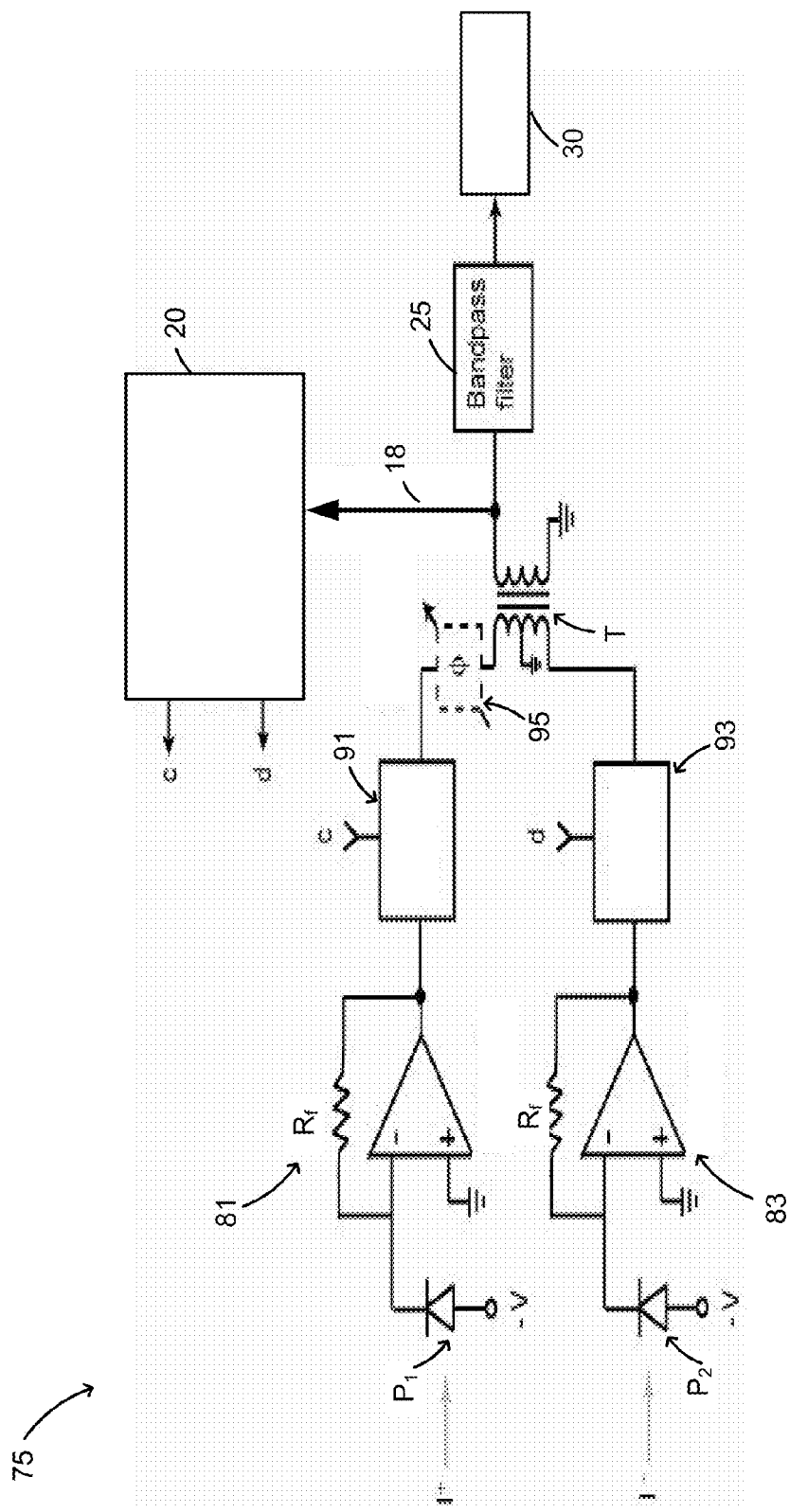
FIG. 5 is a schematic diagram of another embodiment of an actively balanced photoreceiver that includes one or more variable gain amplifiers in accordance with an illustrative embodiment of the invention.

FIG. 5 illustrates another embodiment of system 75 that includes an electronic circuit for intensity noise suppression or reduction. Several of the elements depicted in FIG. 5 are similar to those described above and depicted in FIGS. 2 and 3. A first photodiode $P_1$ and a second photodiode $P_2$ are each in electrical communication with a first and second transimpedance amplifier 81, 83, respectively as shown. In turn, each of the two transimpedance amplifiers 81, 83 are in a electrical communication with first and second variable gain amplifiers 91, 93.

In this system 75, the separate electronic variable-gain amplifiers 91, 93 equalize the noise intensity signals before subtraction in a wideband radio-frequency transformer. Optionally, in one embodiment a phase shifter 95 such as a broadband phase shifter is used. Although this system 75 employs a greater number components than the embodiment of FIG. 3, the use of separate variable-gain amplifiers 91, 93 and (optional) phase-control electronics 95 provides more flexibility for tailoring the frequency matching between the two optical channels (the reference channel and the sample channel) over the entire dynamic control range.

The remaining features of FIG. 5 are similar to those discussed above. The time varying voltage signal at input 18, which is correlated with the photocurrent is transmitted from the transform T. After the transformer stage, the signal continues on to a feedback network 20. In addition, signal can also be filtered using a bandpass filter 25 before reaching an output 30.

Figure 6:
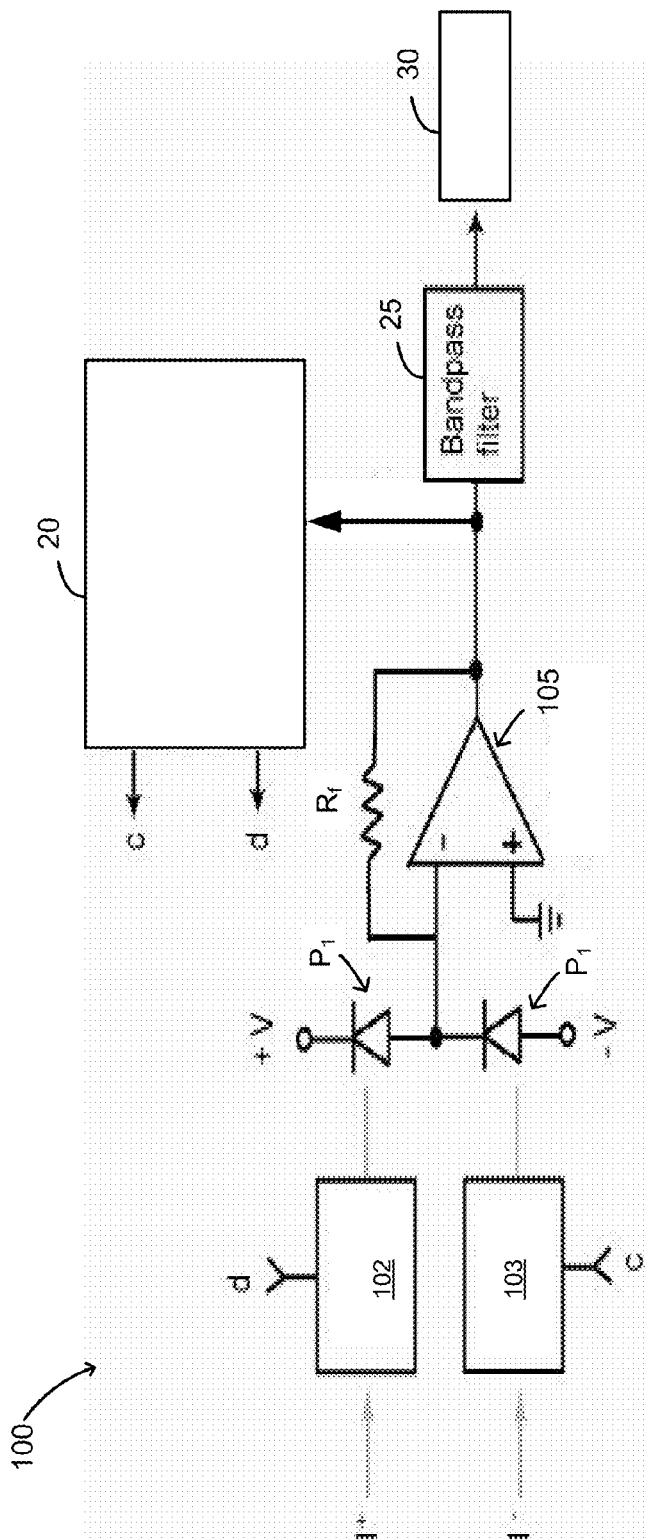
FIG. 6 is a schematic diagram of another embodiment of an actively balanced photoreceiver that includes one or more attenuators in accordance with an illustrative embodiment of the invention.

Still another embodiment of an electronic circuit element-based intensity noise suppression system 100 is depicted in FIG. 6. This embodiment employs two variable optical attenuators (VOAs) 102, 103 to equalize the amplitudes of the photocurrents generated by the light intensities $I_A$ and $I_B$ that impinge on photodiodes $P_1$, $P_2$. The two VOAs are in optical communication with the photodiodes $P_1$, $P_2$. In addition, one or more optical properties of the VOAs are responsive to the control signals c and d. The photodiodes are in turn in electrical communication with a transimpedance amplifier 105. Specifically, the variable optical attenuators 102, 103 equalize the noise intensity signals before subtraction by a transimpedance amplifier 105.

This amplifier 105 is actively balanced by the two VOAs before a photocurrent is received at the amplifier 105 input. Several types of single-mode VOAs, which include MEMs-based, motorized, and electro-optic attenuators, are available that permit continuously variable control of optical transmission with low insertion loss. One advantage of optical attenuation instead of electronic attenuation is that the parasitic reactances introduced by additional circuit elements are eliminated. As a result, frequency dependence of the gain and common mode rejection ratio of the amplifier 105 are reduced. A feedback network 20, a bandpass filter 25, and an output 30 are also shown and are similar to the features described above.

Figure 7:
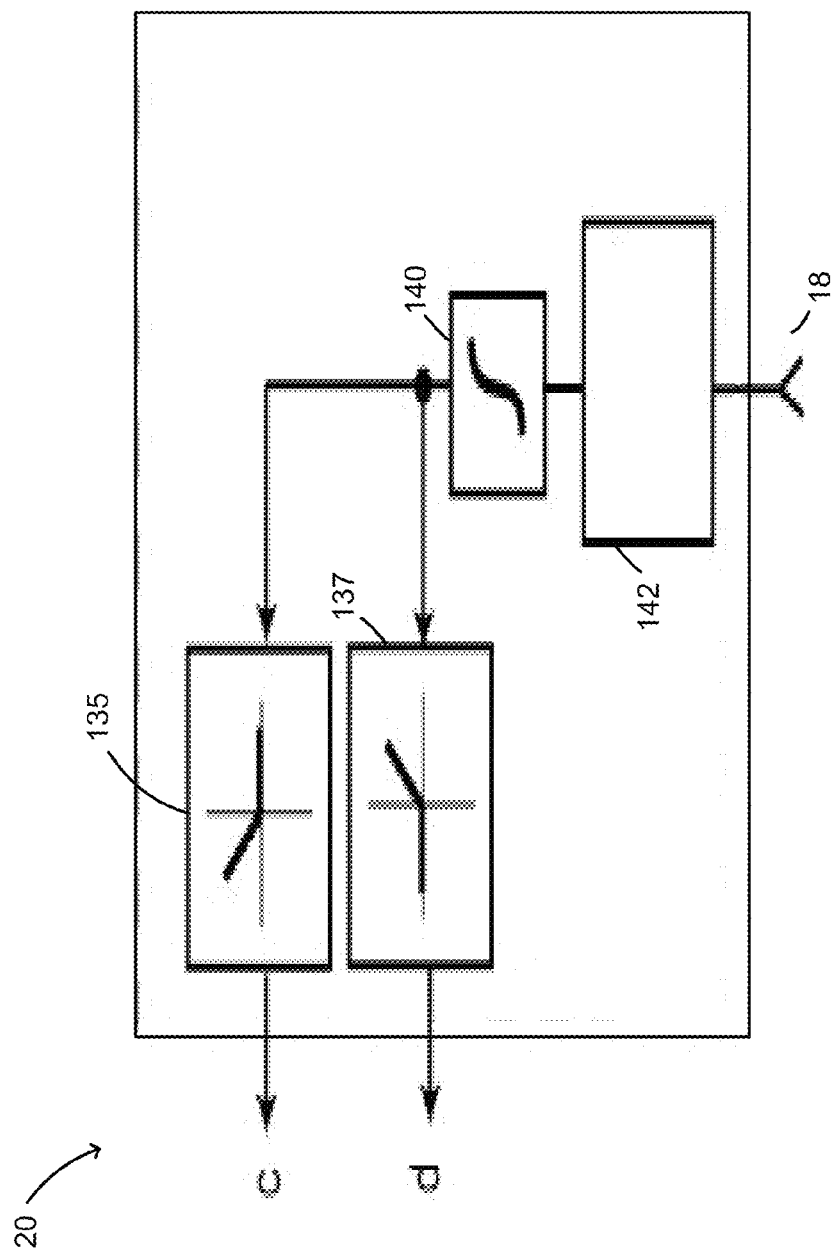
FIG. 7 is schematic diagram of a feedback network embodiment suitable for use with the various systems, methods, and components described herein in accordance with an illustrative embodiment of the invention.

FIG. 7 shows an embodiment of a feedback network 130 for use with any of the systems or components in FIGS. 3-6. A time varying input signal enters the network 20 following photocurrent to voltage conversion or amplification by an amplifier as shown in FIGS. 3-6 and discussed above. In one embodiment, the network 20 is an analog auto-balance feedback network. In another embodiment, the network is implemented using digital components or is responsive to digital signals. In one embodiment this network 20 includes a first amplifier 135 and a second amplifier 137. The network also includes an integrator 140. In addition, in one embodiment the network includes a filter 142 such as a low-pass filter or a general bandpass filter as is appropriate for a given range of frequencies of interest. In one embodiment, the first and second amplifiers 135 and 137 respectively are two high-gain rectifying amplifiers.

In one embodiment, the passband of the filter 142 is chosen to transmit noise with frequencies below the interference signal band (refer to FIG. 9). In some optical coherent tomography systems, such as frequency domain systems, a swept laser source is used such as a Fourier domain mode locked laser with a particular sweep frequency or period. In one embodiment, the noise passband usually includes the sweep repetition frequency of the laser. Thus, in one embodiment, the filter 142 does not transmit any signal data, but rather transmits one or more types of noise for conversion to control signals such as signals c and d. The network 20 is designed to respond fast enough to null or substantially reduce both intra- and inter-sweep variations in laser intensity and other noise generating effects without degrading the integrity of the interference signals in the passband. This embodiment has the advantages of low-cost, simplicity, and speed; it also enables stable bi-directional control at frequencies close to DC.

Figure 8:
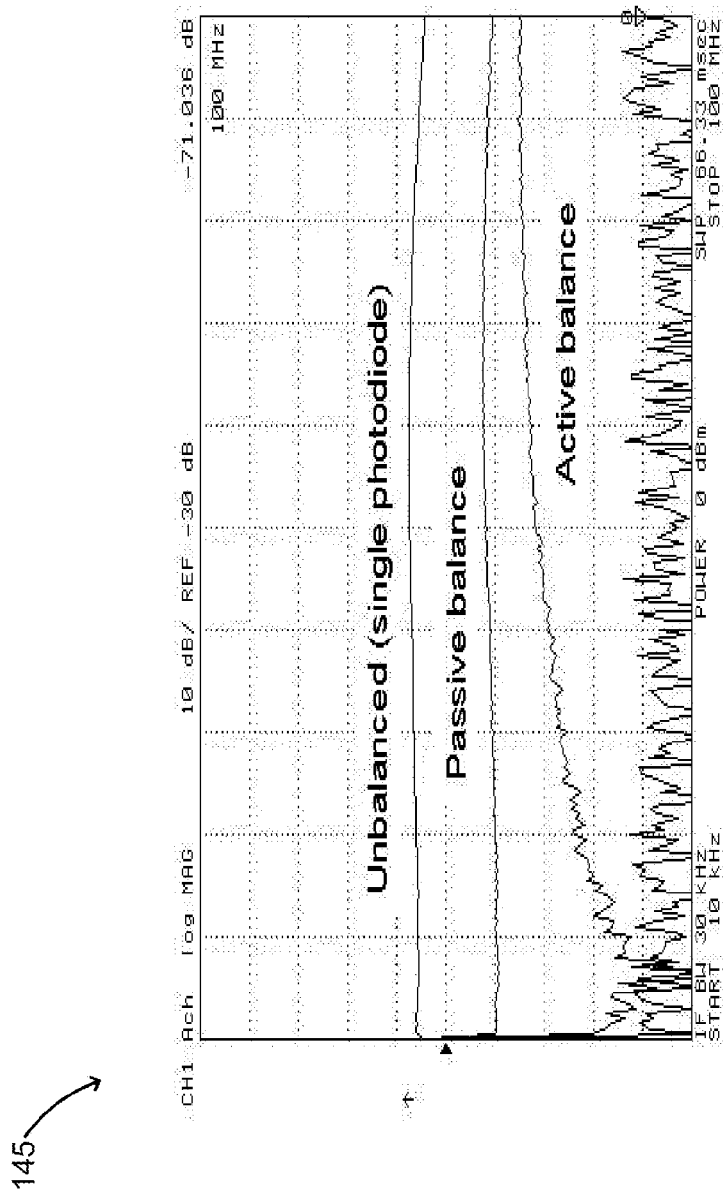
FIG. 8 is a plot of a frequency spectrum of intensity noise in accordance with an illustrative embodiment of the invention.

FIG. 8 is a plot 145 of a frequency spectrum of intensity noise measured at the output of a balanced photoreceiver with (1) single photodiode detection, (2) passively balanced detection, and (3) actively balanced detection according to the preferred embodiment of the invention with low-pass-filtered analog feedback. The X-axis is frequency (units of Hz on logarithmic scale) and the Y axis is signal power (dB units). The noise amplitude spectra in FIG. 8 demonstrate the degree of noise suppression that can be achieved in practice by using active balancing, implemented according to the preferred embodiment of the invention (FIG. 3) with the analog auto-balance network 20 of FIG. 7. Specifically, a review of the curves shown in FIG. 8 indicates that the single photodiode has the most noise, followed by the passively balanced system, and finally that the actively balanced system shows the greatest noise reduction.

Figure 9:
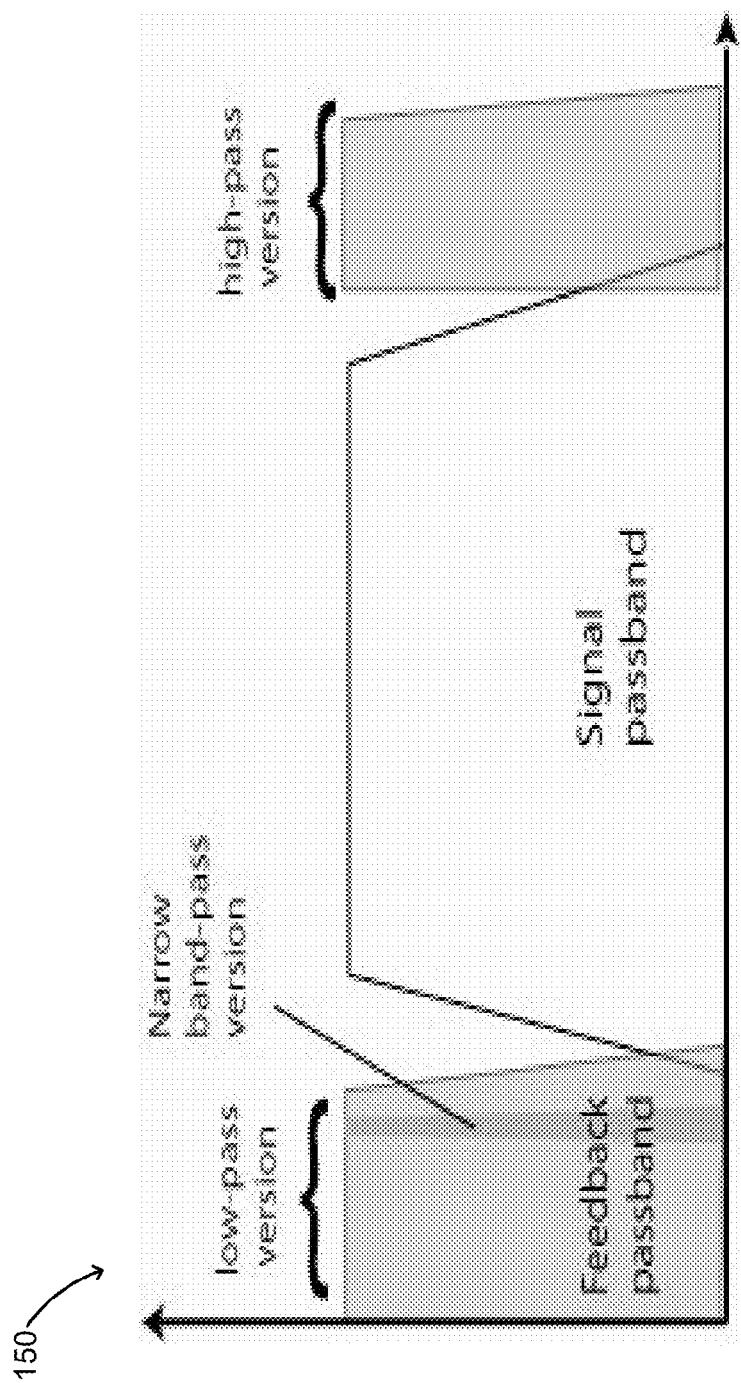
FIG. 9 is a schematic diagram that shows alternative embodiments for the pass band(s) of a used filter in a feedback network in accordance with an illustrative embodiment of the invention.

FIG. 9 is a schematic diagram that shows alternative embodiments for the passband(s) of a filter in a feedback network such as the filter 142 of network 20 or those discussed below such as with respect to FIG. 10. FIG. 9 shows a plot 150 of signal intensity versus frequency for five different frequency passbands. The shaded regions indicate the frequency regions outside of the OCT signal passbands that are available for operation of the feedback filter employed in various embodiments of the autobalancing or active balancing photoreceiver. From left to right, the relevant frequency passbands are as follows: low pass, narrow-band, and high pass. Note that, although the narrow passband is shown in the low-pass region, it can also lie in the high pass region. The signal passband refers to the band of frequencies corresponding to signal of interest, such as collected OCT data for a sample of interest that passes through a given filter. The low and high passbands refer to the frequency bands below and above the signal pass band that contain mostly noise from the light source. The narrow pass band refers to a region within either the high- or low-pass band in which the feedback signals lie.

In one embodiment, a low-pass filter, with a cutoff frequency below the lowest frequency of the signal passband, is used with embodiments of the invention that employ the analog filter network 20 of FIG. 7. A low-pass, narrow bandpass, or high-pass filter can be used with the digital microcontroller feedback network of FIG. 10. The narrow bandpass can be used, for example, with implementations based on synchronous operation. In one embodiment, an optional track/hold input is used for synchronous balancing according to an embodiment of the invention as discussed below.

Figure 10:
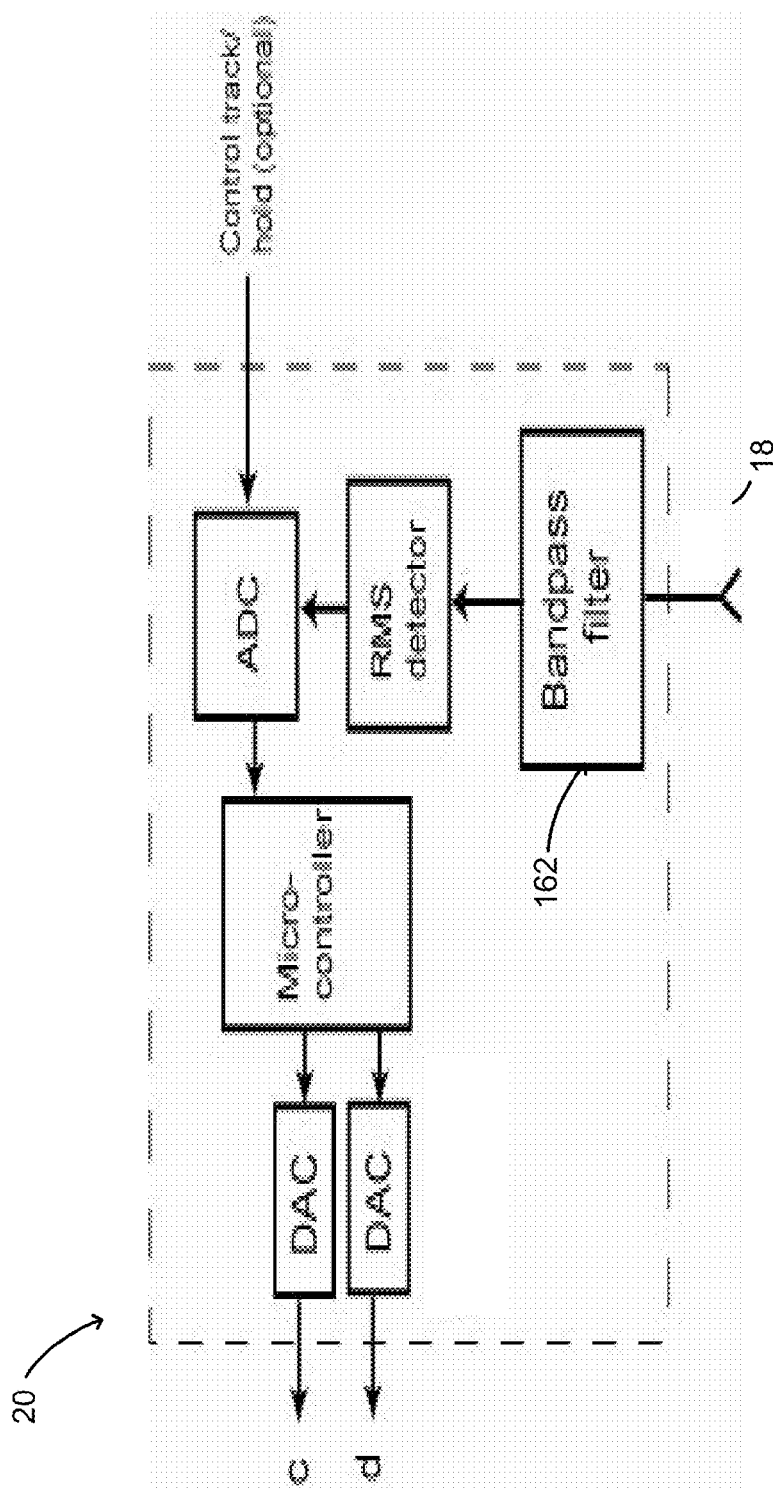
FIG. 10 is a schematic diagram depicting a digital microcontroller feedback network suitable for use with the various systems, methods, and components described herein in accordance with an illustrative embodiment of the invention.

An alternative embodiment of the auto-balance feedback network 20, shown in FIG. 10, employs a microcontroller to adaptively control the feedback parameters for accommodating a variety of filter pass bands and, in some embodiments, synchronous operation. The post-transimpedance amplifier signal is received at input 18 of this network 160. In this embodiment, a low-pass, signal pass-band, or high-pass filter can be employed as the bandpass filter 162 to select the frequency band used to cancel the noise voltage at the output of the transimpedance amplifier (refer to FIG. 9).

As shown, a root-mean-square (RMS) detector produces a voltage proportional to the noise power, which is then sampled by an analog-to-digital converter whose digital output is read by the microcontroller. To maintain a null in the RMS noise voltage level, the microcontroller adjusts either the c or d analog control voltages via digital-to-analog converters. These control voltages are in turn fed back to one of the embodiments shown in FIGS. 3-6 described above to a controllable element or attenuator such as a transistor or optical attenuator. A track and/or hold control signal, which tracks a signal proportional to the balance error of the photo-amplifier during the non-imaging cycle and holds it during the imaging cycle, can also be optionally used as shown and discussed below.

In addition, suitable search methods, such as fast gradient-search routines, can be employed to find and maintain the null or reduced noise level by continuous adjustment of the control voltage such as signals c or d. Since this embodiment of the feedback network relies on RMS nulling, the pass band of the filter does not need to include DC. For convenience of implementation, a bandpass filter with a pass band either above or below the frequency band of the interference signals can be employed. To further flatten the frequency response of the noise suppressor, the sum of the outputs of two RMS detectors connected to filters on both ends of the signal spectrum can be nulled instead of the output of a single RMS detector.

This embodiment lends itself to the use of synchronous detection to improve the tracking accuracy of the feedback and to permit the frequency bands of the intensity noise suppression and the signal bands to overlap. Such improvements can be achieved by using a track/hold signal (FIG. 10) synchronized with the laser sweep that instructs the microcontroller to hold the control voltages found during the non-imaging cycle, the period during the return laser sweep when the interference signal is switched off and the OCT signals are not acquired. The held control voltages can then be applied to the c and d outputs of the digital-to-analog converters during the imaging cycle when the OCT signals are acquired. In this manner, the passband of the feedback filter 162 can be expanded to encompass the entire signal range for optimum noise suppression.

Figure 11:
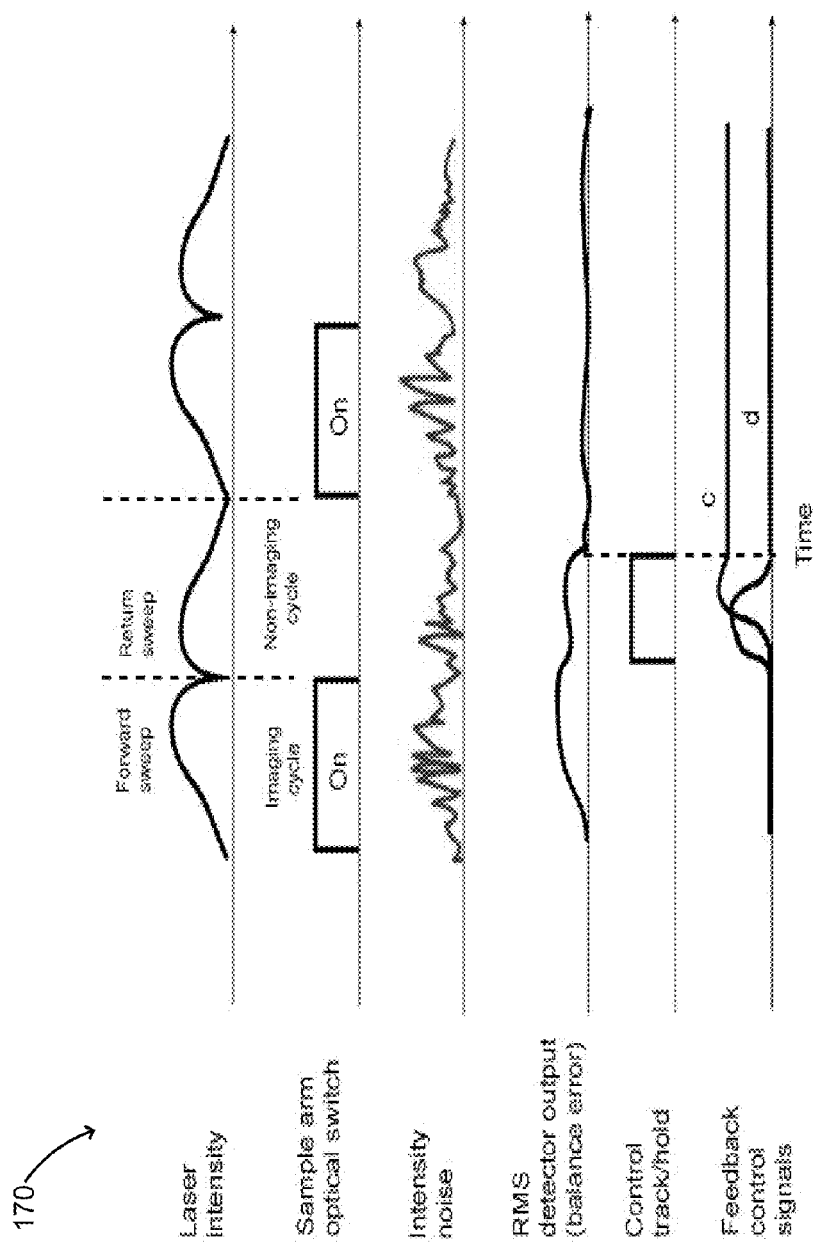
FIG. 11 is a schematic timing diagram in accordance with an illustrative embodiment of the invention.

This synchronous mode of operation can be implemented using the timing diagram of FIG. 11. This synchronous mode of operation enables noise suppression at frequencies within the signal passband. Six exemplary signals relevant to different phases of operation of the embodiments described herein are shown over time in FIG. 11. From the top, these signals and their profile over time include (1) laser intensity, (2) imaging cycle/sample arm of interferometer signals, (3) intensity noise, (4) RMS detector output/balance error, (5) control track and hold signals, and (6) exemplary feedback and control signals such as signals c and d. As shown in FIG. 11, the feedback control voltages generated during the non-imaging cycle (i.e., the time interval during which the light from the sample is switched off) are held and subsequently applied during the imaging cycle.

The effectiveness of a digitally controlled feedback network can be improved further by applying an amplitude modulation to the laser source to serve as a synchronous feedback signal for the auto-balance feedback network. This configuration permits a synchronous demodulator to be used in place of the RMS detector for both phase and amplitude nulling.

Figure 12:
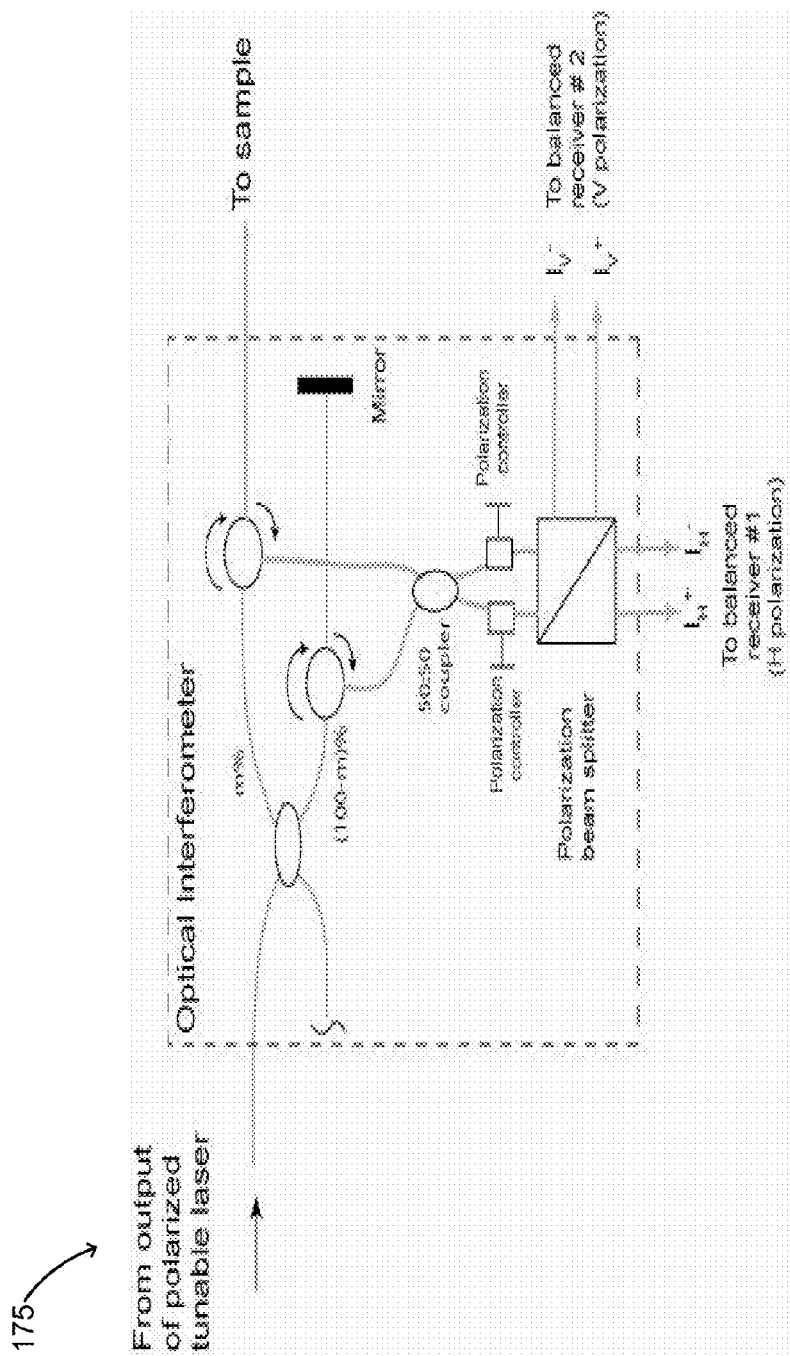
FIG. 12 is a schematic diagram depicting a polarization-diversity FD-OCT system that employs two actively balanced photoreceivers in accordance with an illustrative embodiment of the invention.

In many biological applications of frequency-domain optical coherence tomography, polarization diversity detection is desired to reduce image artifacts produced by birefringent tissues. The noise suppression methods, systems, and devices described herein are suitable for use with polarization-diversity interferometers. For example, the interferometer in FIG. 12 enables polarization-diversity detection using two photoreceiver channels, each with independent active balancing for intensity noise suppression. The system 175 can process different polarization states such as H polarization or V polarization as shown. In addition, as shown in FIG. 12, the two photoreceivers operate independently to suppress laser intensity noise. This system configuration of FIG. 12 uses two polarization controllers to balance the two pairs of output intensities.

With respect to FIG. 12, a disadvantage of this type of interferometer is that, to avoid large losses from excess attenuation applied to one or more of the photodiode channels, the polarization states of the intensity pairs ($I_H^+$, $I_H^-$) and ($I_V^+$, $I_V^-$) must be equalized at the input of the polarization splitter. In one embodiment, this equalization requires independent adjustment of two polarization controllers.

Figure 13:
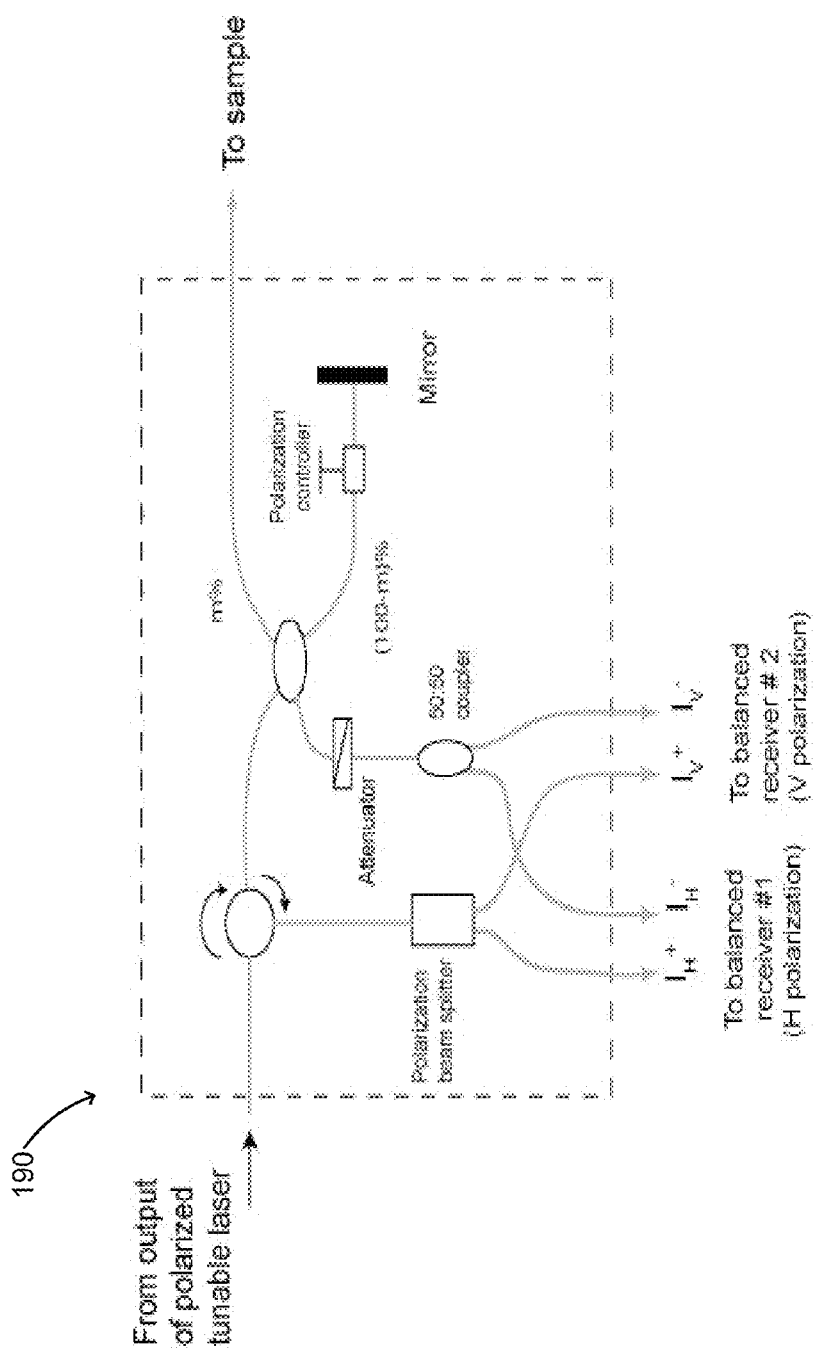
FIG. 13 is a schematic diagram of an FD-OCT system that includes two actively balanced photoreceivers that operate independently to suppress or reduce laser intensity noise in accordance with an illustrative embodiment of the invention.

The interferometer 190 shown in FIG. 13 employs only one polarization controller, which is adjusted to split the reference laser intensity equally between $I_H^+$ and $I_V^+$. This system configuration requires only one polarization controller to balance the two pairs of output intensities. Here the interferometer 190 operates in the unbalanced mode and is configured with an asymmetric splitting ratio, m:(1-m), where m typically equals or exceeds about 0.9. This configuration alleviates the difficulty of equalizing the polarization states on two pairs of photodiodes simultaneously and relies instead on the auto-balance circuits to electronically adjust the attenuations on each channel to achieve noise suppression or reduction.

In the description, the invention is discussed in the context of optical coherence tomography; however, these embodiments are not intended to be limiting and those skilled in the art will appreciate that the invention can also be used for other imaging and diagnostic modalities or optical systems in general.

The aspects, embodiments, features, and examples of the invention are to be considered illustrative in all respects and are not intended to limit the invention, the scope of which is defined only by the claims. Other embodiments, modifications, and usages will be apparent to those skilled in the art without departing from the spirit and scope of the claimed invention.

The use of headings and sections in the application is not meant to limit the invention; each section can apply to any aspect, embodiment, or feature of the invention.

Throughout the application, where compositions are described as having, including, or comprising specific components, or where processes are described as having, including or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes," "including," "have," "has," or "having" should be generally understood as open-ended and non-limiting unless specifically stated otherwise.

The use of the singular herein includes the plural (and vice versa) unless specifically stated otherwise. Moreover, the singular forms "a," "an," and "the" include plural forms unless the context clearly dictates otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

Where a range or list of values is provided, each intervening value between the upper and lower limits of that range or list of values is individually contemplated and is encompassed within the invention as if each value were specifically enumerated herein. In addition, smaller ranges between and including the upper and lower limits of a given range are contemplated and encompassed within the invention. The listing of exemplary values or ranges is not a disclaimer of other values or ranges between and including the upper and lower limits of a given range.

It is to be understood that the figures and descriptions of the invention have been simplified to illustrate elements that are relevant for a clear understanding of the invention, while eliminating, for purposes of clarity, other elements. Those of ordinary skill in the art will recognize, however, that these and other elements may be desirable. However, because such elements are well known in the art, and because they do not facilitate a better understanding of the invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the invention, a single component may be replaced by multiple components, and multiple components may be replaced by a single component, to provide an element or structure or to perform a given function or functions. Except where such substitution would not be operative to practice certain embodiments of the invention, such substitution is considered within the scope of the invention.

The examples presented herein are intended to illustrate potential and specific implementations of the invention. It can be appreciated that the examples are intended primarily for purposes of illustrative of the invention for those skilled in the art. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the claims.

What is claimed is:

1. A method of reducing or suppressing intensity noise from a laser source in an optical coherence tomography system, the method comprising
   transmitting light from a laser to an interferometer, the laser having a sweep period, the interferometer having a reference arm and a sample arm, wherein light emitted by the laser is amplitude modulated at a fixed frequency to create a first signal in a reference arm of the interferometer;
   generating a plurality of photocurrents during an optical coherence tomography data collection session, each of the photocurrents proportional to light received from the interferometer;
   receiving a first photocurrent of the plurality of photocurrents at a first attenuator;
   receiving a second photocurrent of the plurality of photocurrents at a second attenuator;
   automatically attenuating the first photocurrent if higher than the second photocurrent such that an attenuated first photocurrent is generated;
   converting at least one of the plurality of photocurrents and the attenuated first photocurrent to an amplified signal comprising a laser intensity noise component using an amplifier;
   synchronously operating a feedback network with the sweep period of the laser;
   demodulating a second signal at an output of the optical coherence tomography system to generate a phase-sensitive error signal that is processed by a feedback network;
   computing a first control signal, using the feedback network, during a non-imaging cycle of the interferometer; and
   transmitting a first control signal during an imaging cycle to control attenuation of at least one of the plurality of photocurrents to reduce or suppress the laser noise component.

2. The method of claim 1 wherein the first control signal is generated using the laser intensity noise component.

3. The method of claim 1 further comprising the step of transmitting a second control signal to control attenuation of at least one of the plurality of photocurrents.

4. The method of claim 1 further comprising the step of generating the first control signal by filtering the amplified signal, integrating the filtered amplified signal, and amplifying the integrated filtered amplified signal.

5. The method of claim 1 wherein attenuation of at least one of the plurality of photocurrents is changed in response to the control signal being received by the first attenuator and the second attenuator, wherein the first attenuator and the second attenuator are selected from the group consisting of a photoreceiver, a transistor, a diode, a PIN diode, a resistor, a variable optical attenuator, a variable gain amplifier, a pair of resistors in electrical communication with a pair of transistors, and combinations thereof.

6. The method of claim 1 further comprising the step of actively balancing a first photo receiver and a second photoreceiver by repeating the step of transmitting the control signal until the laser noise component reaches a minimum.

7. An optical coherence tomography system comprising
   a first photoreceiver for receiving light from an interferometer in optical communication with a laser having laser intensity noise and in electrical communication with a first resistor;
   a first attenuator in communication with the first photoreceiver and in electrical communication with the first resistor, wherein the first attenuator is configured to change a first electrical property of the first attenuator in response to a first control signal;
   a second photo receiver for receiving light from the interferometer and in electrical communication with a second resistor;
   a second attenuator in communication with the second photoreceiver and in electrical communication with the second resistor, wherein the second attenuator is configured to change a second electrical property of the second attenuator in response to a second control signal, wherein the first and second attenuators are in electrical communication at a first node;

an amplifier having a first input in electrical communication with the first resistor and the second resistor at a second node, the first photoreceiver and a first output, the amplifier configured to transmit, from the first output, an amplified signal comprising a laser intensity noise component; and a feedback network in electrical communication with the amplifier, the feedback network configured to receive the amplified signal and generate the first control signal and the second control signal at least in response to the laser intensity noise component, the first attenuator, the second attenuator, the first resistor and the second resistor arranged in a bridge configuration, wherein the feedback network is configured to operate synchronously with a sweep period of the laser, wherein the feedback network computes the first control signal during a non-imaging cycle of the interferometer and transmits the first control signal during an imaging cycle to reduce or suppress the laser noise component, wherein light emitted by the laser is amplitude modulated at a fixed frequency to create a first signal in a reference arm of the interferometer and wherein a second signal at an output of the system is demodulated to generate a phase-sensitive error signal that is processed by the feedback network.

8. The system of claim 7 wherein the first and second attenuators are selected from the group consisting of a bipolar transistor, a MOSFET, a diode, a PIN diode, a current-splitting attenuator, and a resistor.

9. The system of claim 7 wherein the feedback network comprises (a) a filter that transmits frequencies below an interference signal band, (b) an integrator in electric communication with the filter, and (c) a pair of rectifying amplifiers in electrical communication with integrator.

10. The system of claim 7 wherein the first attenuator is a first transistor and the second attenuator is a second transistor, wherein the first and second transistors are configured to differentially shunt photocurrents at the first input of the amplifier in response to the first and second control signals.

11. The system of claim 7 wherein the first photoreceiver and the second photoreceiver comprise a first actively balanced receiver and further comprising a dual-channel polarization splitter configured to split light from the interferometer into light of a first polarization and light of a second polarization, a second actively balanced receiver comprising a third photoreceiver and a fourth photoreceiver, wherein the first actively balanced receiver is positioned to receive light of a first polarization and the second actively balanced receiver is positioned to receive light of the second polarization.

12. An optical coherence tomography system comprising an interferometer having a sample signal output and a reference signal output;

a laser in optical communication with the interferometer, the laser having laser intensity noise;

an actively balanced photoreceiver for receiving light from the sample signal output and the reference signal output, the actively balanced photoreceiver comprising an attenuator and a control signal input, wherein the attenuator comprises a first resistor and a second resistor connected at a first node and a first controllable element and a second controllable element connected at a second node;

a feedback network in electrical communication with the actively balanced photoreceiver, the feedback network configured to generate a control signal at least in response to the laser intensity noise component such that laser intensity noise or pattern line noise is reduced or suppressed by the attenuator in response to receiving the control signal at the control signal input, wherein the feedback network comprises a filter that transmits frequencies above or below an interference signal band, an integrator in electric communication with the filter, and a pair of rectifying amplifiers in electrical communication with integrator, wherein the first controllable element comprises a first transistor and the second controllable element comprises a second transistor, each of the first and the second transistor in electrical communication with the first resistor and the second resistor.

13. The system of claim 12 wherein the attenuator is selected from the group consisting of a variable optical attenuator, a transistor, a MOSFET, a diode, a PIN diode, a current splitting attenuator, a resistor, a variable gain amplifier, and a microwave transistor.

14. The system of claim 12 wherein the laser intensity noise component is within a frequency range of from about 1 MHz to about 250 MHz.

15. The system of claim 12 wherein the feedback network is configured to operate synchronously with a sweep period of the laser.

16. The system of claim 15 wherein the feedback network computes the control signal during a non-imaging cycle of the interferometer and transmits the control signal during an imaging cycle to reduce or suppress the laser noise component or the pattern line noise.

* * * * *